(12) United States Patent
Accou et al.

(10) Patent No.: US 9,669,550 B2
(45) Date of Patent: Jun. 6, 2017

(54) PICK AND PLACE DEVICE WITH AUTOMATIC PICK-UP-HEIGHT ADJUSTMENT AND A METHOD AND A COMPUTER PROGRAM PRODUCT TO AUTOMATICALLY ADJUST THE PICK-UP-HEIGHT OF A PICK AND PLACE DEVICE

(71) Applicant: KLA-Tencor Corporation, Milpitas, CA (US)

(72) Inventors: Bruno Accou, Linter (BE); Erik De Block, Hong Kong (CN)

(73) Assignee: KLA-Tencor Corporation, Milpitas, CA (US)

( * ) Notice: Subject to any disclaimer, the term of this patent is extended or adjusted under 35 U.S.C. 154(b) by 41 days.

(21) Appl. No.: 14/751,794

(22) Filed: Jun. 26, 2015

(65) Prior Publication Data

US 2015/0298316 A1    Oct. 22, 2015

Related U.S. Application Data

(63) Continuation of application No. PCT/US2015/026478, filed on Apr. 17, 2015.
(Continued)

(51) Int. Cl.
*G06F 7/00* (2006.01)
*B25J 13/08* (2006.01)
(Continued)

(52) U.S. Cl.
CPC ........... *B25J 13/08* (2013.01); *B25J 15/0625* (2013.01); *H05K 13/0408* (2013.01)

(58) Field of Classification Search
None
See application file for complete search history.

(56) References Cited

U.S. PATENT DOCUMENTS

| 4,750,768 A | 6/1988 | Kumar |
| 8,903,541 B2 | 12/2014 | Vangilbergen et al. |

(Continued)

FOREIGN PATENT DOCUMENTS

| EP | 2699071 | 2/2014 |
| JP | 2010-0206103 | 9/2010 |

(Continued)

*Primary Examiner* — Yolanda Cumbess
(74) *Attorney, Agent, or Firm* — Simpson & Simpson, PLLC (57) ABSTRACT

A pick and place device, a method and a computer program product for automatic pick-up-height adjustment. A first pneumatic system has a first and second controllable valves. The second controllable valve is connected with its input port to a vacuum source. An output port of the first controllable valve and an output port of the second controllable valve are connected to a common tube in fluid communication with at least one vacuum nozzle of the pick and place device. A second pneumatic system, with an inlet valve and an outlet valve are in fluid communication via a connecting tube. An open air exhaust and a flow controller are arranged in the connecting tube between the inlet valve and the outlet valve. A flow sensor detects the changes of the small air flow. The flow sensor is via a tube in fluid communication with the at least one vacuum nozzle.

25 Claims, 8 Drawing Sheets

Related U.S. Application Data (60) Provisional application No. 61/981,593, filed on Apr. 18, 2014.

(51) Int. Cl.
    *B25J 15/06*     (2006.01)
    *H05K 13/04*     (2006.01)

(56) References Cited

U.S. PATENT DOCUMENTS

| | | |
|---|---|---|
| 2002/0135191 A1 | 9/2002 | Bolotin et al. |
| 2003/0015459 A1 | 1/2003 | Lu et al. |
| 2006/0075631 A1* | 4/2006 | Case ............... H05K 13/08 29/709 |
| 2008/0014075 A1* | 1/2008 | Pun ............... B65G 49/061 414/806 |
| 2014/0158215 A1* | 6/2014 | Maichl ............ F15B 19/005 137/15.01 |
| 2014/0271083 A1* | 9/2014 | Caveney ......... H01L 21/67173 414/749.5 |
| 2015/0052990 A1* | 2/2015 | Dunkmann ........... F04F 5/52 73/168 |

FOREIGN PATENT DOCUMENTS

| | | | |
|---|---|---|---|
| JP | 2010206103 A * | 9/2010 | |
| JP | 2010-284499 | 7/2012 | |
| PL | EP 2699071 A2 * | 2/2014 | ......... H05K 13/0408 |
| WO | 2014/143436 | 9/2014 | |

\* cited by examiner

Prior Art

PICK AND PLACE DEVICE WITH AUTOMATIC PICK-UP-HEIGHT ADJUSTMENT AND A METHOD AND A COMPUTER PROGRAM PRODUCT TO AUTOMATICALLY ADJUST THE PICK-UP-HEIGHT OF A PICK AND PLACE DEVICE

CROSS REFERENCE TO RELATED APPLICATIONS

This application is filed under 35 U.S.C. §111(a) and §365(c) as a continuation of International Patent Application No. PCT/US2015/026478, filed Apr. 17, 2015, which application claims priority of U.S. Provisional Application No. 61/981,593, filed on Apr. 18, 2014, which applications are incorporated herein by reference in their entirety.

FIELD OF THE INVENTION

The present invention refers to a pick and place device with automatic pick-up-height adjustment.

Furthermore, the present invention refers to a method to automatically adjust the pick-up-height of a pick and place device.

Furthermore, the present invention refers to a computer program product disposed on a non-transitory computer readable medium to automatically adjust the pick-up-height of a pick and place device.

BACKGROUND OF THE INVENTION

Figure 1:
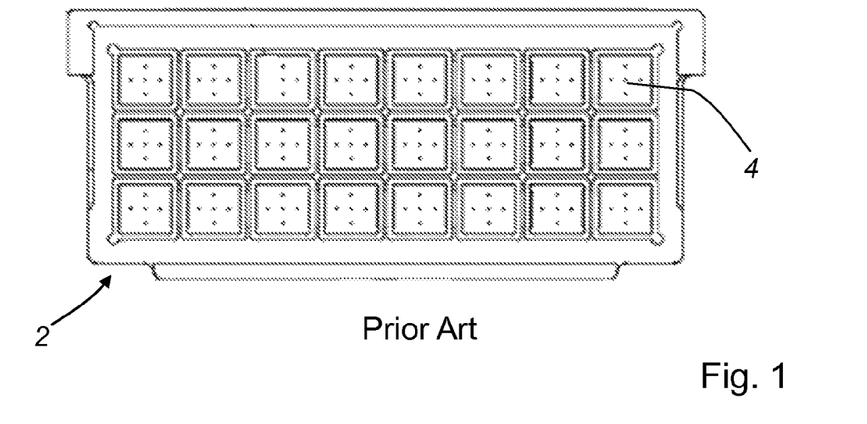
FIG. 1 is a top view of a conventional JEDEC—tray.

Electronic components are often transported in (JEDEC) trays (a molded matrix carrier) during the manufacturing process. A conventional JEDEC tray is shown in FIG. 1. The components are placed in the cells of the trays, and placing components in cells is usually done by pick and place robots. A pick and place robot typically comprises one or several grippers (or pickers) that can pick-up/remove an electronic component from a cell of a tray and also place an electronic component into a cell of a tray. The gripper may be mechanically clamping the electronic component or—more commonly—using vacuum nozzles.

For example, U.S. Pat. No. 8,903,541 B2 discloses a method for positioning electronic devices into compartments. Known positions on an upper side of the input medium are imaged by an inspection device. Actual position data of the compartments of the input medium are calculated on the basis of images of the known positions, given target position data of the known positions, and given target position data of the compartments of the input medium. A pick and place device for the electronic devices is controlled on the basis of the calculated actual position data of the compartments of the input medium.

The international patent application WO 2014/143436 A1 relates to an apparatus for automatic pitch conversion for pick and place heads, comprising at least one auto pitch station for adjusting a pitch in a X coordinate direction and/or adjusting a pitch in a Y coordinate direction of pickers/grippers of a pick and place heads. The pick and place device has a sensing system, which is used to verify the position and the pitch of the pickers/grippers of the individual pick and place heads. Calibration is done as well by the sensing system. There is nothing disclosed, that a verification is carried out of the distance between the pickers/grippers and the electronic component.

Additionally, EP 2 699 071 A2 discloses a head module to pick up and place dedicated components in SMT technology. A body of a head module has a suction nozzle assembly with a gripping element comprising a vacuum duct inside the gripping element. At one end the gripping element is equipped with suction nozzle dedicated to grip components. Vacuum or negative pressure supplied to the suction nozzle is changed using the stepwise method by application of a cut-off valve, thus the suction nozzle sucks and holds the electronic component only when vacuum or negative pressure is supplied to it. After cutting off the vacuum or the negative pressure, the suction nozzle releases and leaves the electronic components in the predetermined place. A linear movement of the gripping component (end position of the gripping component) with the suction nozzle is controlled with an optical switch 98.

A most common method is that the user estimates the contact point visually and adjusts the pick-up height accordingly. Another possibility is the use of the vacuum supply and pressure sensor to detect contact between a picker and an object. This method is used to detect contact between the picker and a heavy object, such as a metal calibration tray or a fixed part of the machine. The picker (with/or without adapter) is moved to the metal part. The picker moves (with vacuum on) down towards the calibration tray. The pressure sensor detects when the vacuum level suddenly builds up in case of contact.

The visual estimation often leads to inaccurate positions due to difficult accessibility of the pickers. Mostly the pickers are close to the devices and the assembly that carries the pickers blocks the visibility. In most cases, safety doors and other assemblies are blocking light to access the area where the visual check is needed. Assessing the correct contact point visually depends on the human capabilities (vision accuracy) so larger errors are common. Using the vacuum supply leads to wrong detection points in case of medium and small devices.

The devices can be sucked up by the vacuum, leading to a wrong detection position of the contact.

When using a vision measurement system, the relative height difference between the measured object and the moveable picker height has to be calibrated or measured. This is very hard to calibrate since the pickup adapter can differ in height after a changeover. In addition, using a displacement sensor or any other vision system is detrimental to the cost effectiveness.

SUMMARY OF THE INVENTION

It therefore is an object of the invention to provide a pick and place device with pick-up-height adjustment which can be done fast in a reliable and reproducible manner, so that a damage of a component in a production process by the pick and place head and any down time of the pick and place head are avoided.

The above object is achieved by a pick and place device with automatic pick-up-height adjustment comprising:
a first pneumatic system wherein a first controllable valve is connected with its input port to an air flow source and a second controllable valve is connected with its input port to a vacuum source, an output port of the first controllable valve and an output port of the second controllable valve are connected to a common tube which is in fluid communication with at least one vacuum nozzle of the pick and place device;
a second pneumatic system, with an inlet valve and an outlet valve in fluid communication via a connecting tube, wherein an open air exhaust and a flow controller are arranged in the connecting tube between the inlet valve and the outlet valve; and a flow sensor, which is in fluid communication with the alt least one vacuum nozzle via a tube.

The advantage of the inventive a pick and place device is that it is possible to detect the exact contact point between the pickup adapter and the object. This improves the machine's stability and also the handling of smaller objects is possible. The reliability is on a high level.

It is a further object of the invention to provide a method to adjust the pick-up-height of a pick and place device without the need of any user intervention and the adjustment can be done fast and in a reliable and reproducible manner, so that a damage of a component in a production process by the pick and place head and any down time of the pick and place head are avoided.

This object is achieved by a method to adjust the pick-up-height of a pick and place device comprising the following steps:

moving a pick and place head of the pick and place device above at least one component in a cell of a JEDEC tray;

opening an inlet valve and an outlet valve of a second pneumatic system, so that the second pneumatic system receives an air flow from an air flow source;

adjusting a flow rate in the second pneumatic system to a predefined level with a flow controller and an open air exhaust;

initiating at least one stepwise motion of the pick and place head in a Z coordinate direction in order to decrease a distance between a vacuum nozzle and a surface of the component in the cell of the JEDEC tray; and storing the distance between the vacuum nozzle and the surface of the component, at which the flow rate, measured by a flow sensor, falls below a predefined level.

The advantage of the inventive method is the ability to detect the exact contact point between the pickup adapter and the component. This improves the pick and place head's stability. Especially the handling of smaller objects (e.g. 3×3 mm and 2×2 mm) leads to a large advantage over the competition.

An object of the invention is as well to provide a computer program product disposed on a non-transitory computer readable medium to automatically adjust the pick-up-height of a pick and place device without the need of any user intervention. The adjustment can be done fast and in a reliable and reproducible manner, so that a damage of a component in a production process with the pick and place head and any down time of the pick and place head are avoided.

The above object is achieved by a computer program product disposed on a non-transitory computer readable medium to automatically adjust the pick-up-height of a pick and place device, the product comprising computer executable process steps operable to control a computer to: move a pick and place head of the pick and place device above at least one component to be picked up; open an inlet valve and an outlet valve of a second pneumatic system, so that the second pneumatic system receives an air flow from an air flow source; adjust a flow rate in the second pneumatic system to a predefined level with a flow controller and an open air exhaust; initiate at least one stepwise motion of the pick and place head in a Z coordinate direction in order to decrease a distance between a vacuum nozzle and a surface of the component; and store the distance between the vacuum nozzle and the surface of the component, at which the flow rate, measured by a flow sensor, falls below a predefined level.

The advantage of the inventive computer program product is the ability to detect the exact contact point between the pickup adapter and the component automatically. This improves the pick and place head's stability and is less expensive. Especially, the handling of smaller objects (e.g. 3×3 mm and 2×2 mm) leads to a large advantage over the competition.

This inventive add-on to the pick and place device provides a very small blowing flow through a picker adapter. The small flow is acquired because of an open exhaust, which allows to get rid of most of the incoming air flow. Next to that a flow controller makes sure that only a very small part of the incoming air flow goes towards the picker adapter. According to an embodiment of the invention an input port of the inlet valve and an output port of the outlet valve of the second pneumatic system are connected to the common tube, and the flow sensor is arranged in the common tube after a connection of the output port of the outlet valve with the common tube. The open air exhaust is connected to an output port of the inlet valve of the second pneumatic system. An outlet port of the air exhaust is connected to the flow controller, which itself is connected to an input port of the outlet valve of the second pneumatic system. According to one embodiment, the input port of the inlet valve of the second pneumatic system is connected via the common tube of the first pneumatic system to the air flow source. The total incoming airflow is adjustable by means of a digital pressure regulator. This regulated pressure is considered as "Soft air blow". Adjusting the incoming airflow can be done to allow fine tuning on the small flow that goes to the picker adapter. This could be necessary for different picker adapters and vacuum nozzles. The digital pressure regulator is controlled by implemented software. The user can modify the setting according to the situation and the software does the rest and automatically adjusts the pickup height.

According to another embodiment the invention the common tube of the first pneumatic system and the second pneumatic system are connected to a pneumatic distribution block. A pressure sensor is mounted to the pneumatic distribution block. An output of the distribution block is connected to the picker adapter via a tube. The second pneumatic system of this embodiment is designed in such a way that it has its own air flow source. The air flow source is directly connected to an input port of the inlet valve of the second pneumatic system. The flow sensor is arranged as well in the connecting tube between the inlet valve and the outlet valve of the second pneumatic system. The flow sensor is connected to an input port of the outlet valve. The pressure sensor, which is part of the distribution block, detects contact between a picker and a surface of the component. Since the air flow through the second pneumatic system towards the vacuum nozzle of the picker is low, the contact blocks the small air flow, which is registered by the pressure sensor In all embodiments the common tube of the first pneumatic system and the connecting tube of the second pneumatic system have a diameter preferably between 2 to 3 mm. The flow sensor is electrically connected to a display for displaying an output signal of the flow sensor. The small flow is measured by a sensitive flow sensor. The picker device is moved stepwise towards at least one component. It is as well thinkable that the at least one component is moved to towards the picker adapter. When the component touches the picker adapter, the flow shall be reduced and/or stopped. The sudden flow difference shall be measured by the flow sensor.

The total incoming airflow into the second pneumatic system is adjustable by means of a digital pressure regulator. This regulated pressure is considered as a "soft air blow". Adjusting the incoming airflow can be done to allow fine tuning on the small flow that goes to the picker adapter. This could be necessary for different picker adapters and vacuum nozzles. The digital pressure regulator is controlled by the software, hence the user can modify the setting according to the situation.

The embodiments of the inventive pick and place device with the implemented system do automatically adjust the pickup height after a changeover or at any other moment during production. This is done without any interaction of the user. When the changeover of the vacuum nozzles is done (the user changes the production package), and the flow could automatically kick in.

The tray arrives at the pick and place head. Then the pick and place head moves the picker with the detection mechanism installed towards the component to measure (can be decided by the software). The system determines the pickup height and the corresponding drop height. There is a relation between pickup and drop height. Typically users set the drop height about 1 mm above the pickup height. With the pickup height detection mechanism, the drop height can automatically be calculated. The machine automatically updates the pickup height and drop height and continues with the production flow.

According to the inventive method a settling time is waited before the flow rate is checked after each stepwise motion of the pick and place head in the Z coordinate direction. In case the flow rate is still above a predefined level a further stepwise motion of the pick and place head is initiated. The settling time is approximately 100 ms. The step size of the move down of the pick and place head depends on the wanted accuracy. A default setting could be 100 micron. The relative motion in the Z-coordinate direction is carried out exclusively by a motor of the pick and place head. In case the air flow is stopped or the flow from an air flow source reaches the predefined flow rate, this actual Z-motor position is stored. An equivalent stored as a Z-motor position is a distance which is considered a pick-up height (adjusted pickup height).

The pick and place head is then moved to an initial start height. The inlet valve and the outlet valve of the second pneumatic system are closed and the pick and place head performs a pick-up with the stored distance between the vacuum nozzle and the surface of the component. A monitoring system is provided to control the pick-up quality. If anything is not within the desired quality an error message is generated.

The advantages of the embodiments disclosed herein are that an open exhaust shall make sure that no pressure is built up during the moments of contact between the picker adapter and the component. After the contact detection routine is finished, the picker device shall be moved away again. At that moment, a sudden burst of flow could occur if the exhaust would not be present. The sudden burst of flow could blow away components from the tray.

The inventive pick and place device, the inventive method and the inventive omputer program product provide the ability to detect the exact contact point between the pickup adapter and the component automatically. This will improve the machine's stability. Firstly, when the pickup adapter is too far away from the component to be picked up, the component can get shifted leading to a misplaced component after the transfer with the pick and place head. Secondly, when the pickup adapter touches the component too hard (overshoot of position), then the component can get shifted as well. Moreover, because of the impact of the high speed picker on the component, the neighboring components can experience vibrations which can lead to components out of their cells of the tray.

The components processed with the conventional handling tools are handled by pickers that carry picker adapters with vacuum nozzles. For each component type the pickup adapter can be changed. The vacuum nozzle is manufactured out of rubber/PEEK/steel, . . . and the dimension tolerances are low. After a changeover, the component's distance to the picker can be changed (because different size of vacuum nozzles). The inventive mechanism allows detecting the exact contact point between the vacuum nozzle (mounted on the picker adapter) and the component to be handled.

Furthermore, the inventive mechanism makes sure that the component(s) which are to be measured as well as the neighboring components are not blown away when detecting the contact point (pickup height). This mechanism makes sure that components are not being sucked up or stick onto the pickup adapter when detecting the contact point.

This inventive mechanism also makes sure that component s are not blown away after the contact is lost. In this mechanism, pressure will not build up and create a higher air flow at the moment of disconnection when the picker is moving away from the component.

This inventive mechanism is less expensive and cost-effective and only requires a few pneumatic and electro-pneumatic parts.

This inventive mechanism will enable the user to redefine the contact point at any moment in a fast and effective way. The detecting of the contact point can be done fully automatically when a new package (first and second pneumatic system) is set up and/or loaded. The user does not need to stop the machine. The detection of the contact point could be done automatically as an auto recovery action.

This inventive mechanism is able to auto detect failures of the mechanism. The same mechanism can be reused for different pickers, by using an electro-pneumatic multiplexing mechanism. This leads to a cost efficient system.

This inventive mechanism can be used to automate the calibration flow, where certain position relations between pickers and other parts in the machine are indicated by the users by a visual estimate. Visual estimations are not accurate. This mechanism is completely neutral when switched off. There's no impact on the existing circuits.

With the exception of one valve, all parts of this mechanism can be mounted on the fixed parts of the machine. There's no need to mount these parts on a moveable picker assembly. The weight increase will be negligible.

This mechanism can be used to detect contact points between pickers or picker adapters and reference objects (trays), such as the transport medium of the objects (components).

BRIEF DESCRIPTION OF THE DRAWINGS

Below, the invention and its advantages will be further described with reference to the accompanying figures in which.

DETAILED DESCRIPTION OF THE INVENTION

In the figures like reference numerals are used for like elements or elements of like function. Furthermore, for the sake of clarity, only those reference numerals are shown in the figures which are necessary for discussing the respective figure.

FIG. 1 shows one embodiment of a conventional JEDEC tray 2. The JEDEC tray 2 is a molded matrix carrier which is used during the manufacturing process of semiconductor devices to handle various components 6. The manufactured components (not shown) are placed in the individual cells 4 of the JEDEC tray 2. The placing of the components 6 in cells 4 is usually done by pick and place robots which have at least one pick and place head (see FIG. 2), The pick and place head typically comprises one or several grippers (or pickers) that can pick-up/remove an electronic component from a cell 4 of the JEDEC tray 2 and also place an electronic component into a cell 4 of the JEDEC tray 2.

Figure 2:
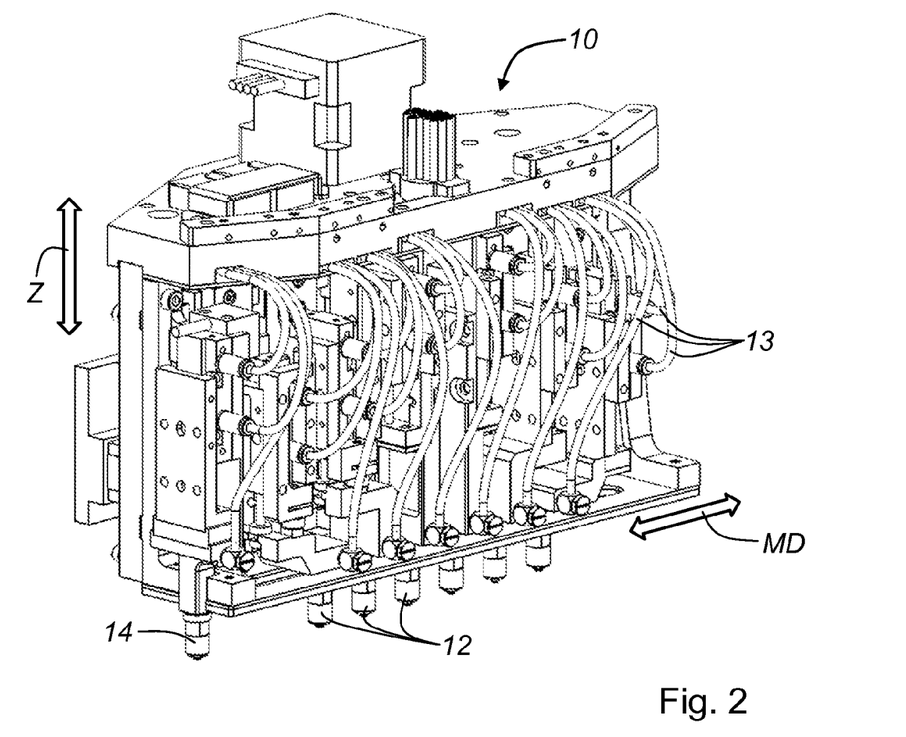
FIG. 2 is a perspective view of an embodiment of a pick and place head for components.
Figure 3:
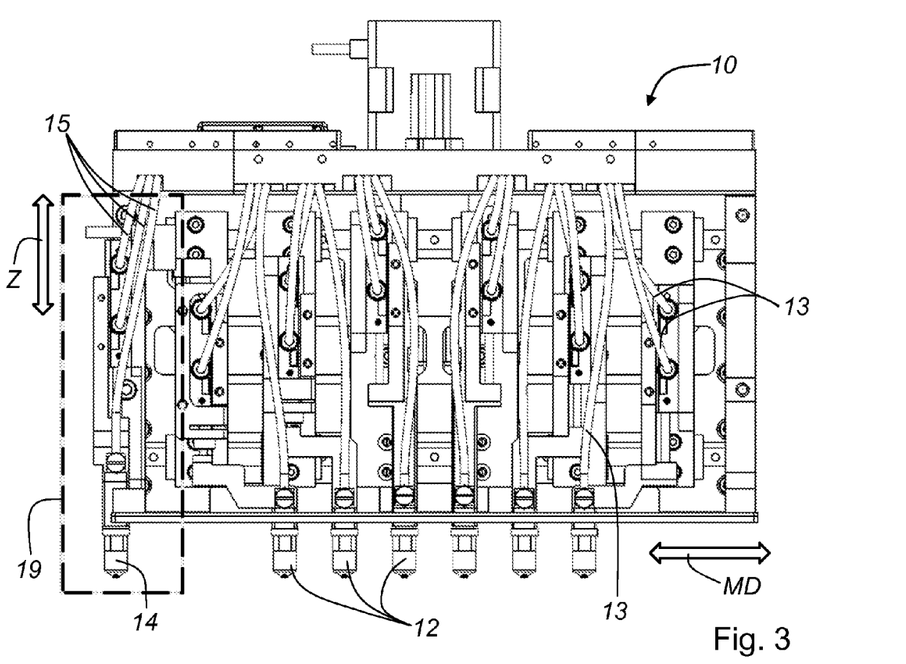
FIG. 3 is a further perspective view of the pick and place head of FIG. 2 with an indication of a picker.

FIG. 2 and FIG. 3 are schematic views of a pick and place head 10. The pick and place head 10 has a plurality of pickers/grippers 12 and an additional picker 14. A tool/machine (not shown) handles the electronic components—for example a tool for automatic inspection of components—wherein the tool/machine needs to handle different sizes of components in order to be cost efficient. Therefore, pickers/grippers 12 are, among others, adjustable in number, pitch, pick up height, etc. Accordingly the pickers/grippers 12 are moveable at least in an adjustment direction MD as indicated in FIGS. 2 and 3. This allows a maximization of the tool operation time. The adjustments, mentioned above, are called changeover and are ideally done fast and automatically.

The pickers/grippers 12 are connected to a plurality of tubes 13 which provide the required vacuum to pick up the components 6 from the cells 4 of the JEDEC tray 2 and/or the required gas flow to drop the components 6 into the cells 4 of the JEDEC tray 2. Additionally, an area 19, encircled by a dashed line, shows the picker 14 which is part of the pick and place head 10. The picker 14 is not movable in the direction MD.

Figure 4:
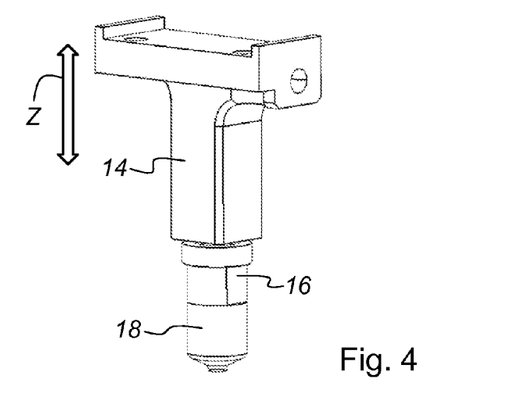
FIG. 4 is an enlarged view of a picker adapter and a vacuum nozzle.

FIG. 4 shows an enlarged view of the picker 14. A vacuum nozzle 18 is mounted on a picker adapter 16. The picker adapter 16 is part of the pick and place head 10. As mentioned above, the pick and place head 10 can move in the X-coordinate direction X, Y-coordinate direction Y, and Z-coordinate direction Z, so that the pickers/grippers 12 and/or the picker 14 can reach the positions of the components in a tray or on a conveyor. The Z-coordinate direction Z (vertical direction) is used to move towards the components 6, pickup from and drop into a certain medium (JEDEC tray or conveyor) which is part of a moveable pick and place assembly (not shown).

Figure 5:
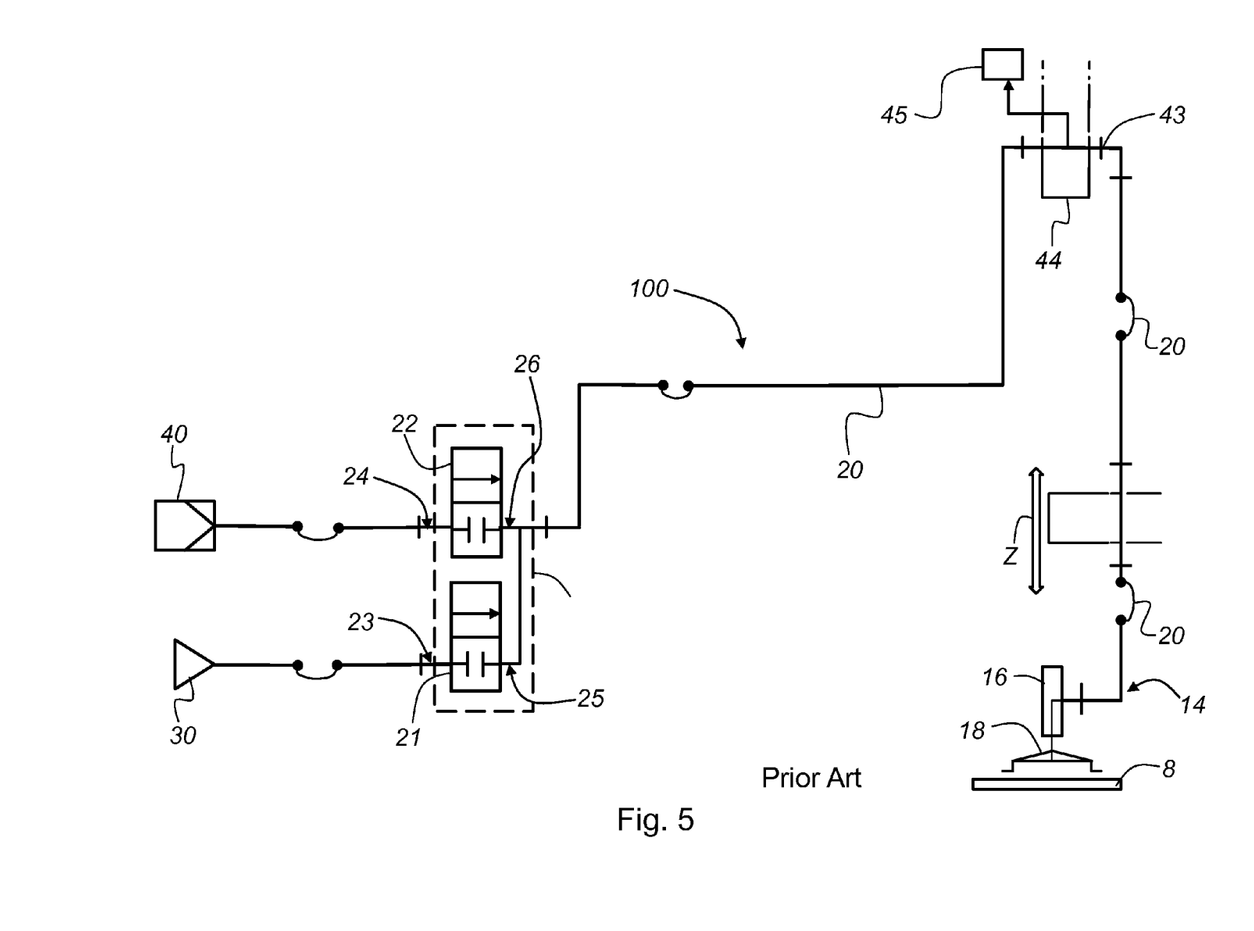
FIG. 5 shows a typical pneumatic set up of a vacuum system with a vacuum nozzle.

FIG. 5 shows a typical pneumatic set up of a first pneumatic system 100. The first pneumatic system 100 has a vacuum source 40 and an air flow source 30. The air flow source 30 is connected to an input port 23 of a first controllable valve 21. The air flow source 30 is configured as a digital pressure regulated system. The vacuum source 40 is connected to an input port 24 of a second controllable valve 22. The vacuum source 40 is configured as a vacuum pump with tank. The output port 25 of the first controllable valve 21 und and the output port 26 of the second controllable valve 22 are connected to a common tube 20 of the first pneumatic system 100. The switching of the first controllable valve 21 and the second controllable valve 22 is controlled by software. A certain vacuum level is used in the common tube 20 to detect contact between a picker and an object. The second controllable valve 22 is controlled such that a certain vacuum level is in the common tube 20 and applied to the vacuum nozzle 18. This prior art concept is used to detect contact between the vacuum nozzle 18 of the picker 14 and a heavy object, such as a metal calibration tray or a fixed part of the machine. The picker 14 (with/or without adapter) is moved to the metal part. Normally a motor, not shown, is used to move the picker 14 (with vacuum on) in the Z-coordinate direction Z towards the calibration tray 8. A pressure sensor 45 is mounted on a distribution block 44. An output 43 of the distribution block 44 connects with a tube to the picker adapter 16. As explained above, the vacuum nozzle 18 is mounted on the picker adapter 16 and is used to pick up the component.

The pressure sensor 45 detects when the vacuum level suddenly builds up. This happens, when the vacuum nozzle 18 is in contact with the calibration tray 8. The height adjustment of the picker 14 is done by the motor (not shown) that controls the motion in the Z-coordinate direction Z. The first pneumatic system 100 alone is not able to teach the pickup and/or drop height. The pickup and/or drop height are adjusted according to the new machine set up and the motor position of the corresponding height is stored in an assigned storage.

The disadvantage of the first pneumatic system 100 as disclosed in FIG. 5 is that the vacuum supply leads to wrong detection points in case of medium and small components to be picked up. The components 6 can be sucked up by the vacuum, leading to a wrong detection position of the contact. A wrong pick up height leads as well to a wrong drop height.

Figure 6:
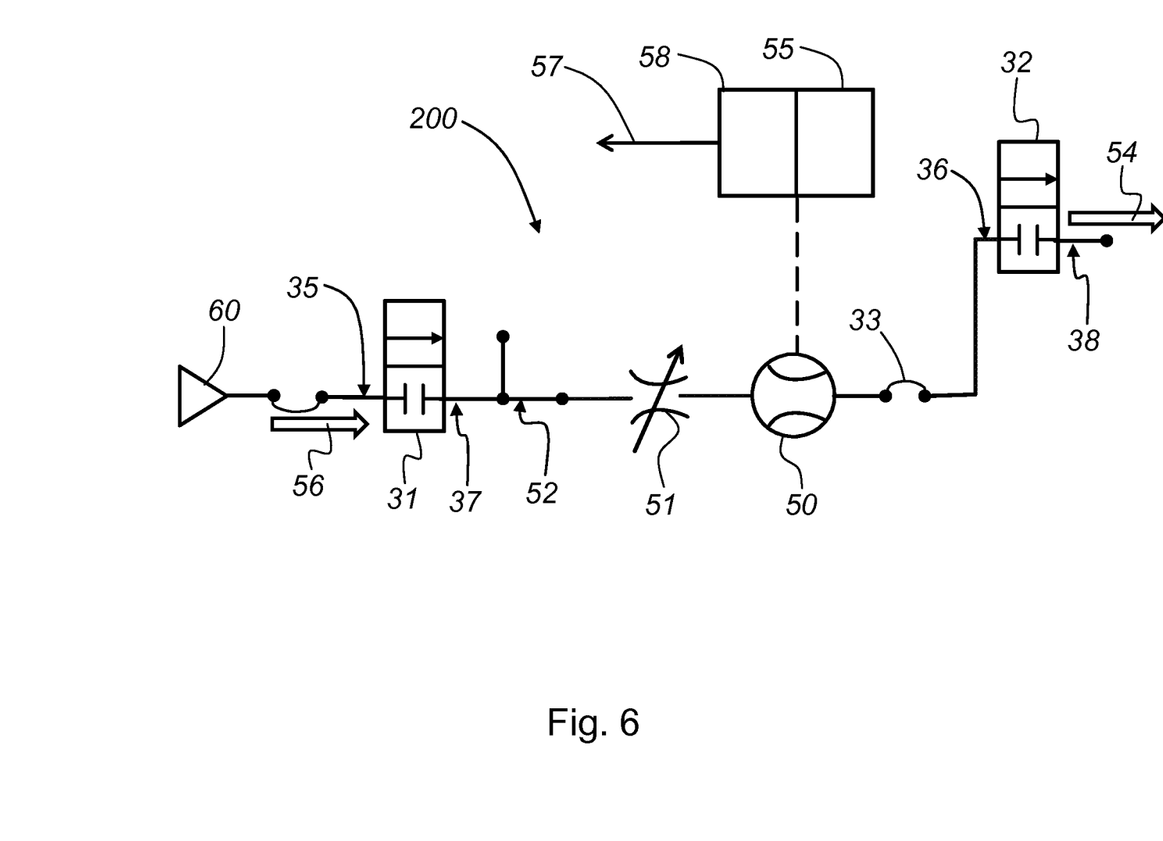
FIG. 6 is a schematic view of the inventive pneumatic system for automatic pick height adjustment of the picker with respect to the component.
Figure 7:
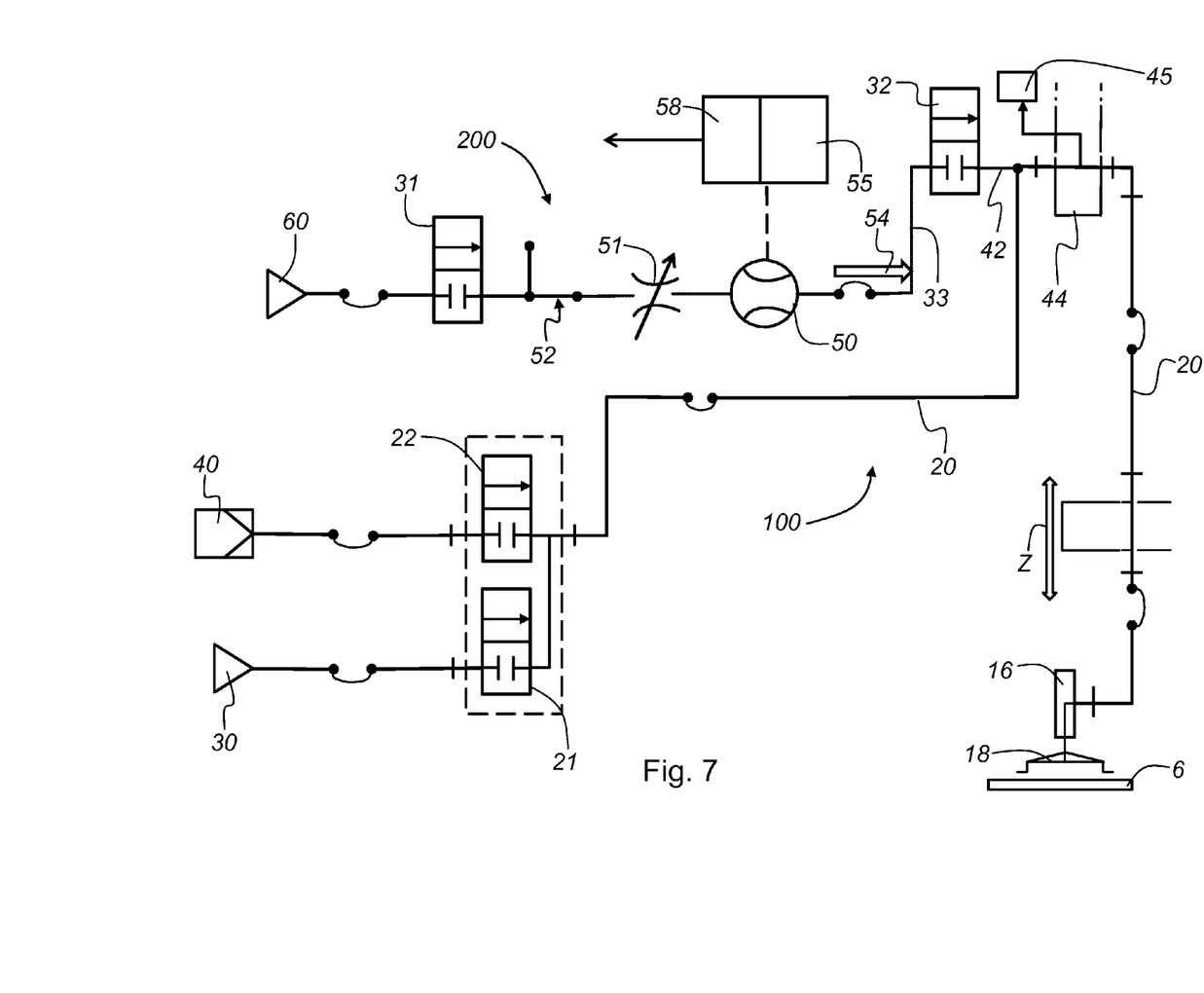
FIG. 7 is a schematic view, showing the integration of the second pneumatic system of FIG. 6 into the first pneumatic system (prior art) of FIG. 5.

FIG. 6 is a schematic view of the inventive second pneumatic system 200 for automatic pick height adjustment of the picker 14 with respect to the component 6 (see FIG. 7). The second pneumatic system 200 has its own air flow source 60. The air flow source 60 provides an incoming air flow 56, which is generated by a digital pressure regulated system. The air flow reaches an inlet valve 31 via an inlet port 35. A small blowing flow 54 exits the second pneumatic system 200 via an output port 38 of an outlet valve 32. Between the output port 37 of the inlet valve 31 and the input port 36 of the outlet valve 32 an open air exhaust 52, a flow controller 51 and a flow sensor 50 are provided in a connecting tube 33 between the inlet valve 31 and the outlet valve 32. The connecting tube 33 preferably has a diameter of 2 to 3 mm. The small blowing flow 54 is acquired because of the open air exhaust 52, which allows to get rid of most of the incoming airflow 56. Next to pen air exhaust 52 the flow controller 51 makes sure that only a very small part of the incoming airflow 56 goes towards the picker adapter 16.

The small air blowing flow 54 is measured by the sensitive flow sensor 50. The picker 14 device shall be moved towards the component 6, or the component 6 towards the picker adapter 16. When the component 6 touches the picker adapter 16, the air blowing flow 54 shall be reduced and/or stopped. The sudden air blowing flow 54 difference shall be measured by the flow sensor 50. The flow sensor 50 is connected to an amplifier and readout logic.

Adjusting the incoming airflow 56 can be done to allow fine tuning on the small flow that goes to the picker adapter 16. This could be necessary for different picker adapters 16 and vacuum nozzles 18. A digital pressure regulator 57 is controlled by software, hence the user can modify the setting according to the situation. The open exhaust 52 shall make sure that no pressure is built up during the moments of contact with the component 6. After the contact detection routine is finished, the picker 14 of the pick and place head 10 shall be moved away again. At that moment, a sudden burst of flow could occur if the open air exhaust 52 would not be present. The output signal of the flow sensor 50 shall be processed by software. A user can interpret the values on a display 58. Depending on the system, the sensitivity can be increased or decreased by changing the boundaries of the parameters of the pick and place head.

The second pneumatic system 200 is able to automatically detect failures in the system. When the inlet valve 31 and the outlet valve 32 are closed, then there should not be any air flow 54, so the readout on the flow sensor 50 should be at the zero readout point. When the inlet valve 31 and the outlet valve 32 are open and the picker 14 is absolutely not making contact with an object or the component 6, then the air flow 54 should be at the expected flow readout. The second pneumatic system 200 can detect if the flow is too high, which could mean that there is a blockage of the open exhaust 52, or too low, which could mean that there is a failure of inlet valve 31 or outlet valve 32 or flow controller 51 or flow sensor 50.

FIG. 7 is a graphical representation of one embodiment of the inventive integration of the second pneumatic system 200 of FIG. 6 into the first pneumatic system 100 (prior art) of FIG. 5. The second pneumatic system 200, which is the detection mechanism, can be reused for other pickers 14 by using an electro-pneumatic multiplexing mechanism (not shown). This can be done by adding extra valves in parallel with the existing outlet valve 32 at the output of the second pneumatic system 200. Software could then control each valve to actuate and hence define which picker 12 shall be used for detection. The second pneumatic system 200 is connected to an input 42 of the distribution block 44 of the first pneumatic system 100.

The combination of the first pneumatic system 100 and the second pneumatic system 200 allows full automatic detection of the pickup height after a changeover or at any other moment during production, without any interaction of the user.

The integration of the second pneumatic system 200 into the first pneumatic system 100 helps to adjust the pickup height after a changeover of a pick and place head 10. When the changeover is done of the vacuum nozzles 18 (the user changes the production package), the blowing flow 54 from the second pneumatic system 200 could automatically kick in.

In the beginning of the process the tray 2 (JEDEC tray) arrives at the pick and place head 10. The pick and place head 10 head moves the picker with the detection mechanism (second pneumatic system 200) installed towards the component 6 to measure. As mentioned above, there are several components 6 in the tray 2 and the software can decide which of the components 6 is used for the adjustment.

The system determines the pickup height and the corresponding drop height. There is a relation between pickup and drop height. A user typically sets the drop height about 1 mm above the pickup height. With the pickup height detection mechanism (second pneumatic system 200), the drop height can automatically be calculated. The machine automatically updates the pickup height and drop height and continues with the production flow.

As explained in detail in the description of FIG. 6, the inventive second pneumatic system 200 is used for automatic pick height adjustment of the picker 14 with respect to the component 6. The small blowing flow 54 exits the second pneumatic system 200 via an output port 38 of an outlet valve 32. The small air blowing flow 54 is measured by the flow sensor 50. The picker 14 device moves towards the component 6, or the component 6 towards the picker adapter 16. The movement is initiated by a motor in the Z-coordinate direction Z. When the component 6 touches the picker adapter 16, the air blowing flow 54 shall be reduced and/or stopped. The sudden air blowing flow 54 difference shall be measured by the flow sensor 50. The flow sensor 50 is connected to an amplifier and readout logic. This sudden stop of the air blowing flow 54 indicates the pickup height and the Z-position of the motor is registered.

Figure 8A:
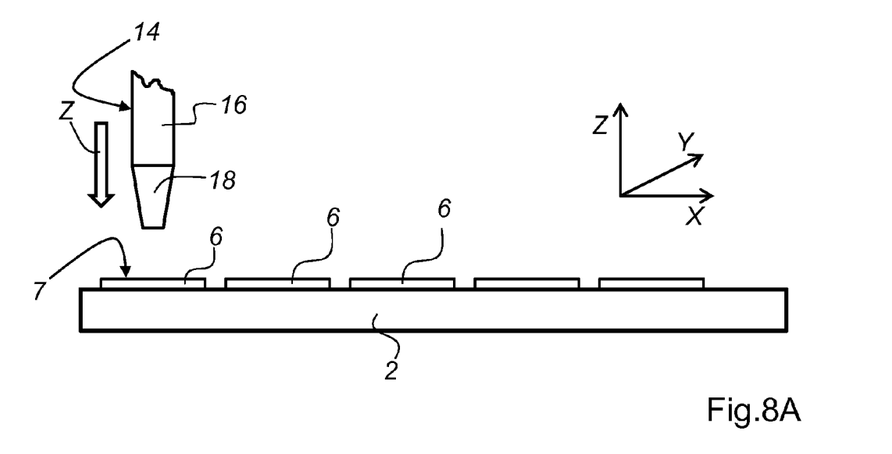
FIG. 8A is a schematic view of the JECEC tray, wherein a vacuum nozzle is placed above a component.
Figure 8B:
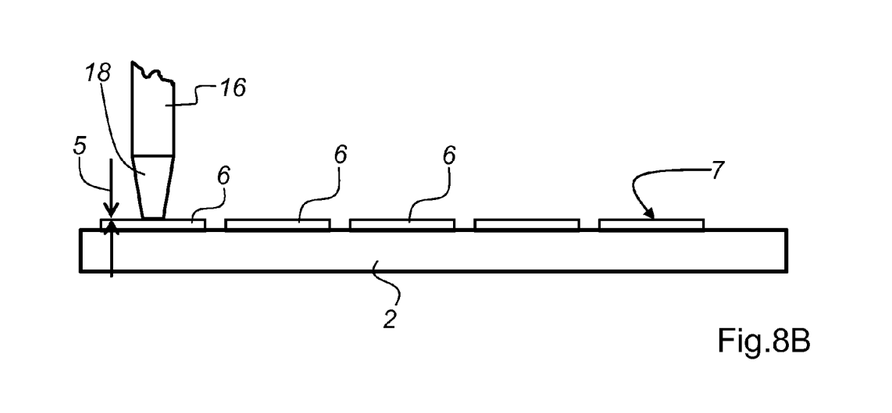
FIG. 8B is a schematic view of the JECEC tray, wherein a vacuum nozzle is in contact with a surface of a component.

FIG. 8A is a schematic view of the JECEC tray 2, wherein a vacuum nozzle 18 is placed above a component 6 and FIG. 8B is a schematic view of the JECEC tray 2 wherein the vacuum nozzle 18 is now in contact with a surface 7 of a component 6. As mentioned above, the adjustment of the pick-up height is carried out in that at least one picker 14 of the pick and place head 10 is lowered in a stepwise motion along the Z-coordinate direction Z to a specific component 6 on the JEDEC tray 2. The second pneumatic system 200 (see FIGS. 6 and 7) provides the air blowing flow 54 through the vacuum nozzle 18. At the time of contact of the vacuum nozzle 18 with the surface 7 of a component 6 (see FIG. 8B), the air blowing flow 54 is stopped which is measured by the flow sensor 50. This stop of the air blowing flow 54 is an indication for the pick height 5. The pick and place head 10 has an electro-pneumatic mechanism (first pneumatic system 100 and second pneumatic system 200) to accurately detect the contact point between a component 6 and a vacuum nozzle 18 by means of the status of the air blowing flow. This allows for automatically adjusting the pick-up height 5 and drop height of the pick and place head 10.

Figure 9:
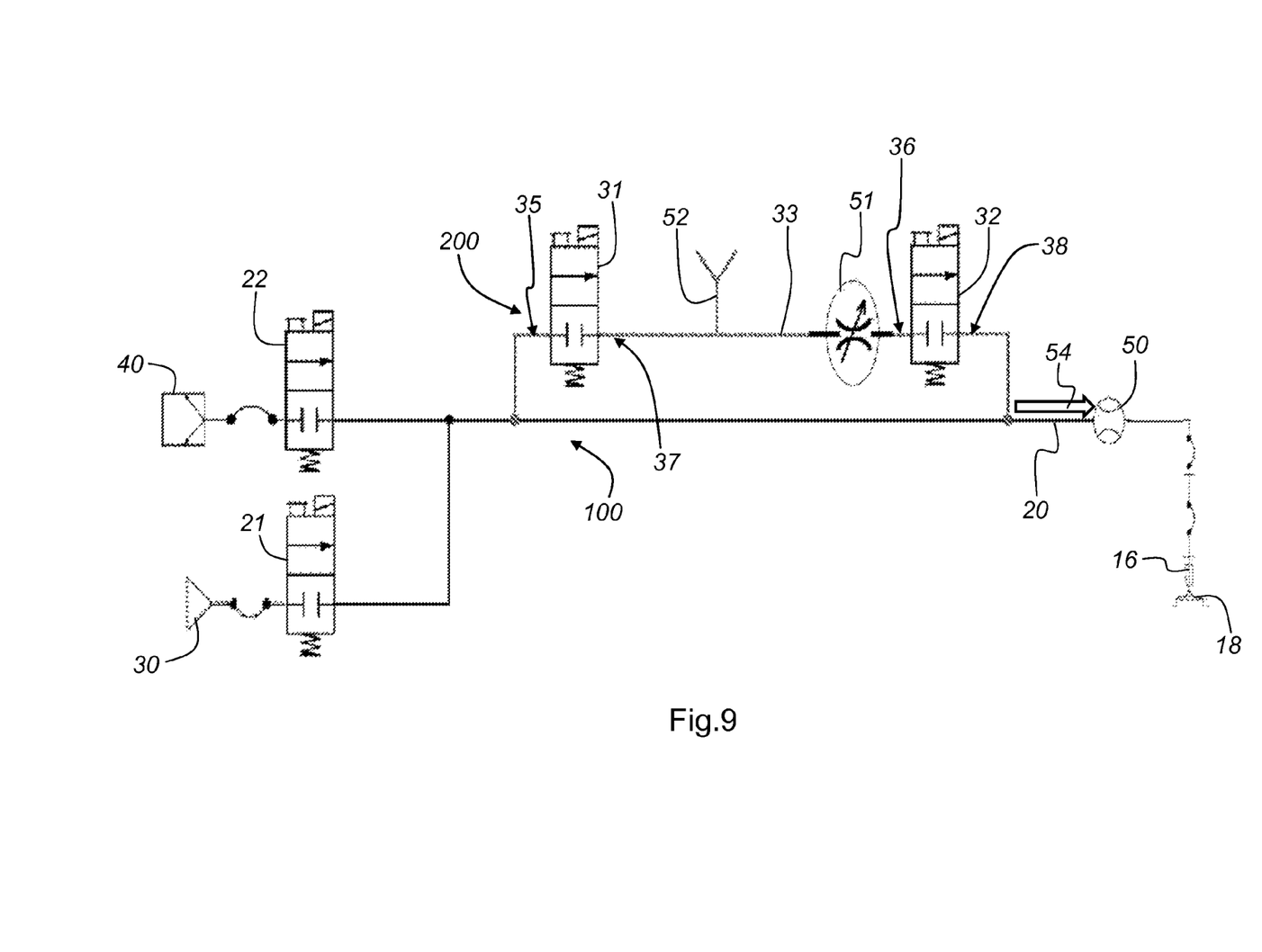
FIG. 9 is a further embodiment of a pneumatic setup for automatic pick height adjustment.

FIG. 9 is a further embodiment of a pneumatic setup for automatic pick height adjustment. The second pneumatic system 200 is connected with the input port 35 of the inlet valve 31 and with the output port 38 of the outlet valve 32 to the common tube 20 of the first pneumatic system 100. The open air exhaust 52 and the flow controller 51 are in the common tube 33 between the inlet valve 31 and the outlet valve 32 of the second pneumatic system 200. In case the inlet valve 31 and the outlet valve 32 of the second pneumatic system 200 are open and the first controllable valve 21 of the first pneumatic system 100 is open a blowing flow 54 is provided in the first pneumatic system 100. The blowing flow 54 is directed via the flow sensor 50 to the picker adapter 16 and the vacuum nozzle 18. The functionality of the embodiment shown in FIG. 9 is identical to the functionality of the embodiment shown in FIG. 7. The common tube 20 of the first pneumatic system 100 and the common tube 33 of the second pneumatic system 200 preferably have a diameter of 2 to 3 mm.

Figure 10:
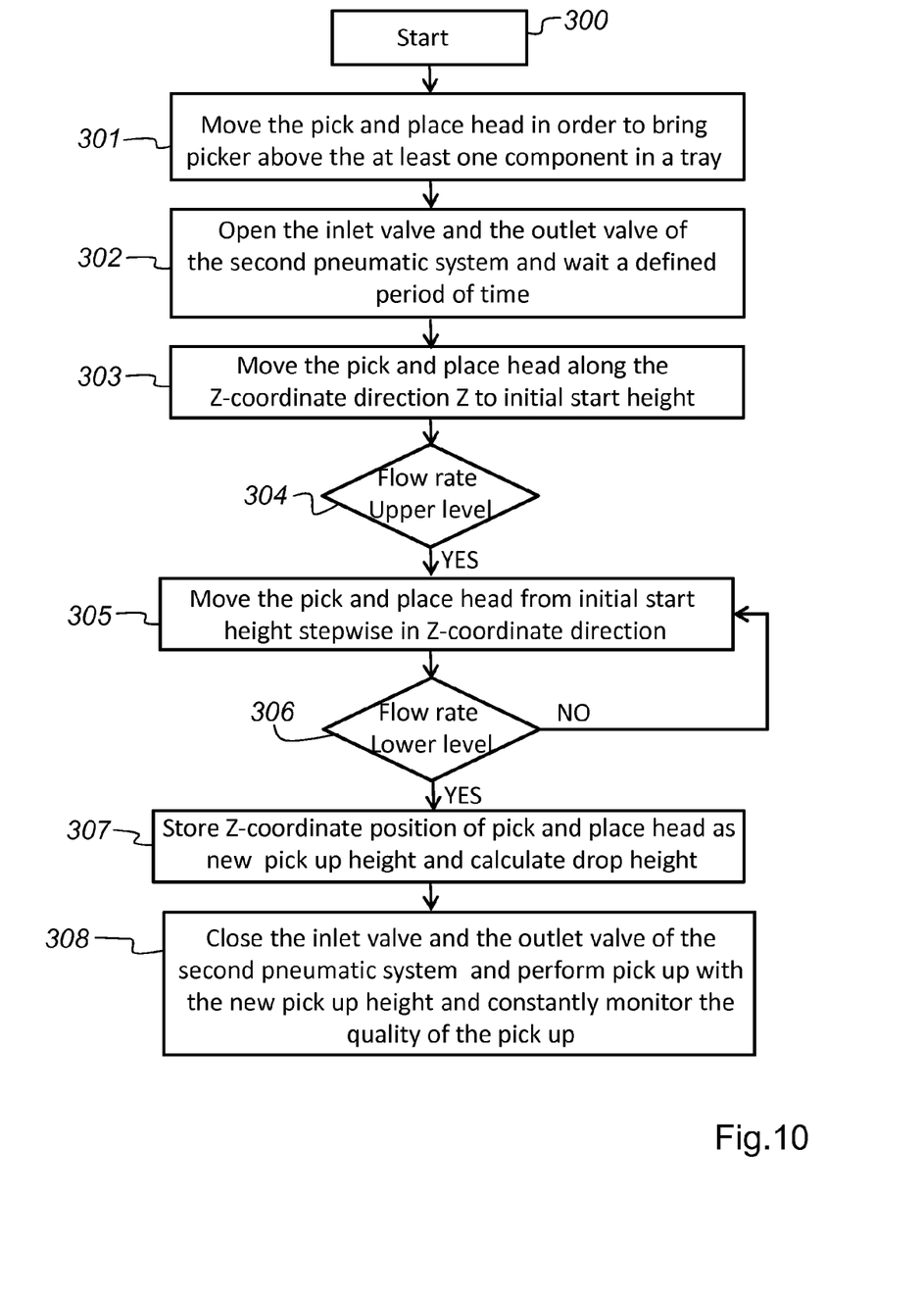
FIG. 10 a flowchart of the inventive method.

FIG. 10 discloses a flowchart of a method to automatically adjust the pick-up-height of a pick and place head 10 of a pick and place device. After a changeover or at any other moment during production it might become necessary to adjust the pickup height. According to the invention the inventive mechanism allows full automatic detection of the pickup height without any interaction of the user. After the start 300 of the adjustment process an initial step 301 moves a pick and place head 10 of the pick and place device above at least one component 6 in a cell 4 of a JEDEC tray 2. In a next step 302 an opening of the inlet valve 31 and the outlet valve 32 of the second pneumatic system 200 is carried out. The second pneumatic system 200 receives an air flow from an air flow source 30, 60. Before an additional step is carried out, the process waits a predetermined period of time in order to let the air flow in the second pneumatic system 200 reach an equilibrium. A preferred time period is 200 ms. In a further step 303 at least one stepwise motion of the pick and place head is initiated in a Z coordinate direction Z. The movement of the pick and place head is directed in the Z coordinate direction Z from an initial start height down to a height above the component 6. The movement in the Z coordinate direction Z decreases a distance between the vacuum nozzle of the pick and place head 10 and the surface 7 of the component 6 in the cell 4 of the JEDEC tray 2. A one step of movement of the pick and place head 10 a first check 304 of the flow rate is carried out. In case the checked flow rate is still at or above an upper level (the flow rate is still high) in a following step 305, the pick and place head 10 moves one further step down (in Z-coordinate direction). The step size of the movement depends on wanted accuracy, wherein a possible default value could be 100 micron. After the step 305 a settlement time is waited before the flow rate is checked once again. A possible default value for the settlement time could be 100 ms. With a second check 306 it is checked if the flow rate is at or below a lower level (the flow rate is low). In case the result of the second check 306 is "YES" it is concluded that a contact point between the vacuum nozzle 18 and the surface 7 of the component 6 is detected.

In the next step 307 the distance between the vacuum nozzle 18 and the surface 7 of the component 6 is stored. The distance could be zero or slightly greater than zero. The distance is defined by the flow rate, measured by a flow sensor, which is below a predefined level. In order to find the detected position of the pick and place head 10 once again, the Z-motor position of the pick and place head is stored.

In a last step 308 the pick and place head 10 is moved up slowly to an initial start height. The move of the pick and place head clears contact with component to be picked up. The inlet valve 31 and the outlet valve 32 of the second pneumatic system 200 are closed. The pick and place head can perform pick up with the newly determined pick up height 5. The pickup is constantly monitored. In case the pickup is ok the single component 6 is place back into the tray 2 and automatic production is continued. In case the pickup failed a stop is initiated and an error message is created. This means that the pickup height has to be adjusted once again.

The advantage of the present invention is the ability to detect the exact contact point between the pickup adapter or vacuum nozzle and the component. This improves the machine's stability. Especially for smaller objects (e.g. 3×3 mm and 2×2 mm) this will lead to a large advantage over the competition.

It is believed that the method and system of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

LIST OF REFERENCE NUMERALS

2 JEDEC tray
4 cell
5 pick-up height
6 component
7 surface of component
8 calibration tray
10 pick and place head
12 pickers/grippers
13 tubing
14 picker
15 tubing
16 picker adapter
18 vacuum nozzle
19 area
20 common tube
21 first controllable valve
22 second controllable valve
23 input port
24 input port
25 output port
26 output port
30 air flow source
31 inlet valve
32 outlet valve
33 connecting tube
35 input port
36 input port
37 output port
38 output port
40 vacuum source
42 input
43 output
44 distribution block
45 pressure sensor
50 flow sensor
51 flow controller
52 open air exhaust
54 blowing flow
55 amplifier and readout logic
56 incoming airflow
57 digital pressure regulator
58 display
60 own air flow source
100 first pneumatic system
200 second pneumatic system
300 start
301 initial step
302 next step
303 further step
304 first check
305 step
306 second check
307 step 308 last step
MD adjustment direction
X X-coordinate direction
Y Y-coordinate direction
Z Z-coordinate direction

The invention claimed is:

1. A pick and place device with automatic pick-up-height adjustment comprising:
   a first pneumatic system including:
      a first controllable valve connected with its input port to a first air flow source; and,
      a second controllable valve connected with its input port to a vacuum source, wherein an output port of the first controllable valve and an output port of the second controllable valve are connected to a common tube which is in fluid communication with at least one vacuum nozzle of the pick and place device;
   a second pneumatic system including:
      an inlet valve and an outlet valve which are in fluid communication via a connecting tube, wherein an open air exhaust and a flow controller are arranged in the connecting tube between the inlet valve and the outlet valve; and,
   a flow sensor, which is in fluid communication with the at least one vacuum nozzle via a tube.

2. The pick and place device as claimed in claim 1, wherein:
   the input port of the inlet valve and an output port of the outlet valve of the second pneumatic system are connected to the common tube; and,
   the flow sensor is arranged in the common tube after a connection of the output port of the outlet valve with the common tube.

3. The pick and place device as claimed in claim 1, wherein:
   the open air exhaust is connected to an output port of the inlet valve of the second pneumatic system; and,
   an outlet port of the air exhaust is connected to the flow controller, which is connected to an input port of the outlet valve of the second pneumatic system.

4. The pick and place device as claimed in claim 1, wherein an input port of the inlet valve of the second pneumatic system is connected via the common tube of the first pneumatic system to the first air flow source.

5. The pick and place device as claimed in claim 1, wherein:
   the common tube of the first pneumatic system and the second pneumatic system are connected to a pneumatic distribution block;
   a pressure sensor is mounted to the pneumatic distribution block; and,
   an output of the distribution block is connected to the picker adapter via a tube.

6. The pick and place device as claimed in claim 5, wherein the second pneumatic system comprises a second air flow source, which is directly connected to an input port of the inlet valve of the second pneumatic system.

7. The pick and place device as claimed in claim 5, wherein:
   a flow sensor is arranged as well in the connecting tube between the inlet valve and the outlet valve of the second pneumatic system; and,
   the flow sensor is connected to an input port of the outlet valve.

8. The pick and place device as claimed in claim 1, wherein the common tube of the first pneumatic system and the connecting tube of the second pneumatic system having a diameter between 2 to 3 mm.

9. The pick and place device as claimed in claim 1, wherein the flow sensor is electrically connected to a display for displaying an output signal of the flow sensor.

10. A method to automatically adjust the pick-up-height of a pick and place device comprising a first pneumatic system comprising a first air flow source and a second pneumatic system comprising a second air flow source, the method comprising the steps of:
    moving a pick and place head of the pick and place device above at least one component in a cell of a JEDEC tray;
    opening an inlet valve and an outlet valve of the second pneumatic system, so that the second pneumatic system receives an air flow from the second air flow source;
    adjusting a flow rate in the second pneumatic system to a predefined level with a flow controller and an open air exhaust;
    initiating at least one stepwise motion of the pick and place head in a Z coordinate direction in order to decrease a distance between a vacuum nozzle and a surface of the component in the cell of the JEDEC tray; and
    storing a Z-position between the vacuum nozzle and the surface of the component, at which the flow rate, measured by a flow sensor falls below a predefined level.

11. The method of claim 10, further comprising:
    waiting a settling time before the flow rate is checked after each stepwise motion of the pick and place head in the Z coordinate direction; and,
    initiating, in case the flow rate is above a predefined level, a further stepwise motion.

12. The method of claim 10, further comprising:
    carrying out the relative motion in the Z-coordinate direction exclusively by a motor of the pick and place head; and
    storing a Z-motor position as an equivalent of the stored distance, at which the air flow from the second air flow source reaches the predefined flow rate and the stored distance is considered a pick-up height.

13. The method of claim 12, further comprising:
    calculating, from the pick-up height, a drop height so that the drop height is greater than the pick-up height.

14. The method of claim 10, further comprising:
    moving the pick and place head to an initial start height;
    closing the inlet valve and the outlet valve of the second pneumatic system; and,
    performing, with the pick and place head, a pick-up with the stored distance between the vacuum nozzle and the surface of the component.

15. The method of claim 14, further comprising:
    providing a monitoring system to control pick-up quality; and,
    generating an error message if the pick-up quality does not meet preset standards.

16. A computer program product disposed on a non-transitory computer readable medium to automatically adjust the pick-up-height of a pick and place device a comprising first pneumatic system comprising a first air flow source and a second pneumatic system comprising a second air flow source, the product comprising:
    computer executable process steps operable to control a computer to:
       move a pick and place head of the pick and place device above at least one component to be picked up;

open an inlet valve and an outlet valve of the second pneumatic system, so that the second pneumatic system receives an air flow from the second air flow source; adjust a flow rate in the second pneumatic system to a predefined level with a flow controller and an open air exhaust;

initiate at least one stepwise motion of the pick and place head in a Z coordinate direction in order to decrease a distance between a vacuum nozzle and a surface of the component; and, store the Z-position between the vacuum nozzle and the surface of the component, at which the flow rate, measured by a flow sensor falls below a predefined level.

17. The computer program product disposed on a non-transitory computer readable medium of claim 16, wherein:
a predetermined time interval is waited after the opening of the an inlet valve; and,
the outlet valve of the second pneumatic system to allow the air flow from the second air flow source to reach the predefined flow rate.

18. The computer program product disposed on a non-transitory computer readable medium of claim 15, wherein:
a settling time is waited before the flow rate is checked after each stepwise motion of the pick and place head in the Z coordinate direction; and,
in case the flow rate is above a predefined level a further stepwise motion is initiated, and it is carried on until the flow rate measured by the flow sensor falls below a predefined level.

19. The computer program product disposed on a non-transitory computer readable medium of claim 16, wherein:
the relative motion in the Z-coordinate direction is carried out exclusively by a motor of the pick and place head; and,
a Z-motor position is stored as an equivalent of the stored distance, at which the air flow from the second air flow source reaches the predefined flow rate and the stored distance is considered a pick-up height.

20. The computer program product disposed on a non-transitory computer readable medium of claim 16, wherein from the pick-up height a drop height is calculated so that the drop height is less than the pick-up height.

21. The computer program product disposed on a non-transitory computer readable medium of claim 16, wherein:
the pick and place head is moved to an initial start height;
the inlet valve and the outlet valve of the second pneumatic system are closed; and,
the pick and place head performs a pick-up with the stored distance between the vacuum nozzle and the surface of the component.

22. The computer program product disposed on a non-transitory computer readable medium of claim 21, wherein the pick-up quality is controlled and an error message is generated if the pick-up quality does not meet preset standards.

23. A method to automatically adjust the pick-up-height of a pick and place device, which has a first pneumatic system comprising a first air flow source and a second pneumatic system comprising a second air flow source, the method comprising:
moving a pick and place head of the pick and place device to an initial start height above at least one component to be picked up;
opening an inlet valve and an outlet valve of the second pneumatic system, so that the second pneumatic system receives an air flow from the second air flow source;
waiting a predetermined time interval to obtain a constant flow rate over time at a predefined level, wherein the predefined level is set by a flow controller and an open air exhaust of the second pneumatic system;
carrying out at last one stepwise motion of the pick and place head in a Z coordinate direction and thereby storing an actual Z-position of the pick and place head;
measuring the flow rate after each stepwise motion and if the flow rate is below a predefined level the actual Z-position of the pick and place head is stored and defined as a pick-up height;
closing the inlet valve and an outlet valve of the second pneumatic system;
moving the pick and place head the initial start height;
calculating a drop height, which is greater than the pick-up height of the component; and
performing a pickup of at least one component.

24. The method of claim 23, further comprising:
controlling the pick-up of at least on component; and,
generating an error message when the pick-up fails.

25. The method of claim 23, further comprising:
controlling the pick-up of at least one component; and,
automatically continuing a production process when the pick-up is correct.

* * * * *